(12) United States Patent
Li et al.

(10) Patent No.: US 11,929,031 B2
(45) Date of Patent: Mar. 12, 2024

(54) DISPLAY SUBSTRATE COMPRISING PIXEL ELECTRODE DISPOSED IN SAME LAYER AS TRANSPARENT CONDUCTIVE ELECTRODE, AND DETECTION METHOD THEREFOR, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Guangyao Li, Beijing (CN); Zheng Liu, Beijing (CN); Haitao Wang, Beijing (CN); Jun Wang, Beijing (CN); Dongfang Wang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,597

(22) PCT Filed: Jan. 15, 2021

(86) PCT No.: PCT/CN2021/072098

§ 371 (c)(1),
(2) Date: May 20, 2022

(87) PCT Pub. No.: WO2021/143824

PCT Pub. Date: Jul. 22, 2021

(65) Prior Publication Data

US 2023/0005430 A1    Jan. 5, 2023

(30) Foreign Application Priority Data

Jan. 17, 2020   (CN) .................. 202010053738.X

(51) Int. Cl.
*G09G 3/3233*   (2016.01)
*G09G 3/20*   (2006.01)
(Continued)

(52) U.S. Cl.
CPC ......... *G09G 3/3266* (2013.01); *G09G 3/2096* (2013.01); *G09G 3/3233* (2013.01);
(Continued)

(58) Field of Classification Search
CPC .. G09G 3/3266; G09G 3/2096; G09G 3/3233; G09G 3/006; G09G 2300/0408;
(Continued)

(56) References Cited

U.S. PATENT DOCUMENTS

2009/0174646 A1   7/2009  Lim
2015/0287741 A1   10/2015 Wang et al.
(Continued)

FOREIGN PATENT DOCUMENTS

CN   103941507 A   7/2014
CN   107967888 A   4/2018
(Continued)

OTHER PUBLICATIONS

CN202010053738.X first office action, dated Dec. 17, 2021.
PCT/CN2021/072098 international search report and written opinion, dated Apr. 19, 2021.

*Primary Examiner* — Adam J Snyder
(74) *Attorney, Agent, or Firm* — IPro, PLLC

(57) ABSTRACT

Provided are a display substrate and a detection method therefor, and a display apparatus. Compensation sub-circuits that are in one-to-one correspondence with each stage of a shift register are arranged in a gate driving circuit, and a first capacitor in each compensation sub-circuit is thus charged under the control of a detection input circuit when each stage of the shift register outputs a signal stage by stage; and an output control circuit is used to disconnect the compensation sub-circuit from a pull-up node of the corresponding stage of the shift register. The triggering of each stage of the shift register is stopped after each stage of the shift register (Continued)

(CR(n)) completes outputting, and the output control circuit provides a signal of a first power voltage end to the pull-up node of the corresponding stage of the shift register under the control of a second control end and the first capacitor.

9 Claims, 14 Drawing Sheets

(51) Int. Cl.
 G09G 3/3266 (2016.01)
 G11C 19/28 (2006.01)
 G09G 3/00 (2006.01)
(52) U.S. Cl.
 CPC ............. *G11C 19/28* (2013.01); *G09G 3/006* (2013.01); *G09G 2300/0408* (2013.01); *G09G 2300/043* (2013.01); *G09G 2300/0842* (2013.01); *G09G 2310/0286* (2013.01); *G09G 2310/08* (2013.01); *G09G 2330/021* (2013.01)
(58) Field of Classification Search
 CPC ..... G09G 2300/043; G09G 2300/0842; G09G 2310/0286; G09G 2310/08; G09G 2330/021; G11C 19/28
 See application file for complete search history.

(56) References Cited

U.S. PATENT DOCUMENTS

| | | | | |
|---|---|---|---|---|
| 2015/0340385 A1* | 11/2015 | Li | ................ | H01L 27/1262 438/155 |
| 2018/0337682 A1* | 11/2018 | Takasugi | ............. | G09G 3/3266 |
| 2019/0103049 A1* | 4/2019 | Noh | ................. | G09G 3/3266 |
| 2019/0130848 A1* | 5/2019 | Kim | ................. | G09G 3/3266 |
| 2019/0164478 A1* | 5/2019 | Kim | ................. | G09G 3/3266 |
| 2019/0206293 A1 | 7/2019 | Tian et al. | | |
| 2019/0251891 A1 | 8/2019 | Tang et al. | | |
| 2019/0251928 A1 | 8/2019 | Du et al. | | |
| 2020/0020266 A1 | 1/2020 | Feng et al. | | |
| 2020/0135115 A1* | 4/2020 | Chang | ................. | G09G 3/3266 |
| 2020/0372851 A1* | 11/2020 | Kim | ................. | G09G 3/2092 |
| 2021/0065603 A1 | 3/2021 | Feng et al. | | |
| 2021/0065829 A1 | 3/2021 | Feng et al. | | |
| 2021/0142713 A1 | 5/2021 | Feng et al. | | |
| 2021/0201767 A1* | 7/2021 | Park | ................. | G09G 3/3266 |
| 2021/0201770 A1* | 7/2021 | Park | ................. | G09G 3/3266 |
| 2021/0201807 A1 | 7/2021 | Feng et al. | | |
| 2021/0201814 A1* | 7/2021 | Choi | ................. | G09G 3/3266 |
| 2021/0201816 A1* | 7/2021 | Kim | ................. | G09G 3/3266 |
| 2022/0005400 A1 | 1/2022 | Feng et al. | | |

FOREIGN PATENT DOCUMENTS

| | | |
|---|---|---|
| CN | 108320692 A | 7/2018 |
| CN | 108877627 A | 11/2018 |
| CN | 109935187 A | 6/2019 |
| CN | 109935269 A | 6/2019 |
| CN | 110136653 A | 8/2019 |
| CN | 110428772 A | 11/2019 |
| CN | 110459155 A | 11/2019 |
| CN | 110517637 A | 11/2019 |
| CN | 111081180 A | 4/2020 |
| JP | 2009058685 A | 3/2009 |
| KR | 20170078978 A | 7/2017 |

* cited by examiner

Controlling a cascade output terminal of a shift register in each stage to output a valid potential signal, to enable the output control circuit to disconnect a signal transmission with a pull-up node of the corresponding-stage shift register under control of the second control terminal, and to enable the detection input circuit to charge the first capacitor under control of the first control terminal and the first input terminal ~S201

Detecting a voltage of a second pole of a first capacitor in each detection circuit, and determining whether the detection circuit is abnormal ~S202

Fig. 12

DISPLAY SUBSTRATE COMPRISING PIXEL ELECTRODE DISPOSED IN SAME LAYER AS TRANSPARENT CONDUCTIVE ELECTRODE, AND DETECTION METHOD THEREFOR, AND DISPLAY APPARATUS

CROSS-REFERENCE OF RELATED APPLICATIONS

The disclosure is a US National Stage of International Application No. PCT/CN2021/072098, filed on Jan. 15, 2021, which claims the priority of the Chinese Patent Application No. 202010053738.X, filed with the Chinese Patent Office on Jan. 17, 2020 and entitled "Array Substrate and Detection Method therefor, and Display Apparatus", which is hereby incorporated by reference in its entirety.

FIELD OF INVENTION

The disclosure relates to the field of displays, and in particular, to a display substrate and a detection method therefor, and a display apparatus.

BACKGROUND

With the rapid development of display technologies, a display panel is increasingly developing towards a direction with high integration and low cost. Here, a Gate Driver on Array (GOA) technology of a display substrate integrates a Thin Film Transistor (TFT) gate switch circuit on the display substrate of the display panel to form a scan drive for the display panel, thereby omitting a wiring space of a bonding area of a gate Integrated Circuit (IC) and a fan-out area. This can not only reduce a product cost in terms of material cost and preparation process, but also make the display panel realize an aesthetic design with two symmetrical sides and narrow border; and this integrated process can also omit the bonding process in a direction of the gate scanning line, thereby improving the productivity and yield.

SUMMARY

An embodiment of the disclosure provides a display substrate, where the display substrate has a display area and a frame area; the frame area is provided with a gate drive circuit; the gate drive circuit includes a plurality of shift registers cascaded on a base substrate and compensation sub-circuits in one-to-one correspondence to the shift registers; and each of the compensation sub-circuits includes: a detection input circuit, a first capacitor and an output control circuit; wherein:

the detection input circuit is electrically connected to a first control terminal, a first input terminal, and first and second poles of the first capacitor respectively; the detection input circuit is configured to charge the first capacitor under control of the first control terminal and the first input terminal; a first input terminal of a compensation sub-circuit corresponding to a $n^{th}$-stage shift register is electrically connected to a cascade output terminal of a $(n-y)^{th}$-stage shift register, wherein y is an integer greater than or equal to 1;

the second pole of the first capacitor is electrically connected to a first power voltage terminal; and the output control circuit is electrically connected to a second control terminal, the first pole of the first capacitor, the first power voltage terminal, and a pull-up node of a corresponding-stage shift register respectively, and the output control circuit is configured to provide a signal of the first power voltage terminal to the pull-up node of the corresponding-stage shift register under control of the second control terminal and the first capacitor.

In some embodiments, in the display substrate provided by the embodiment of the disclosure, the display area includes a pixel electrode;

the second pole of the first capacitor includes a transparent conductive electrode disposed in a same layer as the pixel electrode.

In some embodiments, in the display substrate provided by the embodiment of the disclosure, the second pole of the first capacitor further includes a first metal electrode electrically connected to the transparent conductive electrode;

the first pole of the first capacitor includes a second metal electrode; and the first metal electrode, the second metal electrode and the transparent conductive electrode are disposed in different layers, and the first metal electrode and the second metal electrode are both located between the transparent conductive electrode and the base substrate.

In some embodiments, in the display substrate provided by the embodiment of the disclosure, the display area further includes a data signal line and a scan signal line;

the first metal electrode is arranged in a same layer as the scan signal line, and the second metal electrode is arranged in a same layer as the data signal line; or, the second metal electrode is arranged in a same layer as the scan signal line, and the first metal electrode is arranged in a same layer as the data signal line.

In some embodiments, in the display substrate provided by the embodiment of the disclosure, the detection input circuit includes: a first transistor, a second transistor and a third transistor; wherein:

a gate of the first transistor is electrically connected to the first control terminal, a first pole of the first transistor is electrically connected to the first input terminal, and a second pole of the first transistor is electrically connected to a first pole of the second transistor and a first pole of the third transistor respectively;

a gate of the second transistor is electrically connected to the first control terminal, and a second pole of the second transistor is electrically connected to the first pole of the first capacitor and a gate of the third transistor respectively; and a second pole of the third transistor is electrically connected to the second pole of the first capacitor.

In some embodiments, in the display substrate provided by the embodiment of the disclosure, the output control circuit includes: a fourth transistor and a fifth transistor; wherein:

a gate of the fourth transistor is electrically connected to the first pole of the first capacitor, a first pole of the fourth transistor is electrically connected to the first power voltage terminal, and a second pole of the fourth transistor is electrically connected to a first pole of the fifth transistor; and a gate of the fifth transistor is electrically connected to the second control terminal, and a second pole of the fifth transistor is electrically connected to the pull-up node of the corresponding-stage shift register.

In some embodiments, in the display substrate provided by the embodiment of the disclosure, each of the shift registers includes: an input circuit, a reset circuit, a node control circuit, a first output circuit, a second output circuit and a pull-down circuit; in the $n^{th}$-stage shift register:

the input circuit is electrically connected to a second input terminal, a third input terminal and a pull-up node respectively; and the input circuit is configured to provide a signal of the third input terminal to the pull-up node under control of the second input terminal;

the reset circuit is electrically connected to a fourth input terminal, a second power voltage terminal and the pull-up node respectively; and the reset circuit is configured to provide a signal of the second power voltage terminal to the pull-up node under control of the fourth input terminal;

the node control circuit is electrically connected to the pull-up node and a pull-down node respectively; and the node control circuit is configured to make potentials of the pull-up node and the pull-down node opposite to each other;

the first output circuit is electrically connected to the pull-up node, a first clock signal terminal and a cascade output terminal of the shift register respectively; and the first output circuit is configured to provide a signal of the first clock signal terminal to the cascade output terminal of the shift register under control of the pull-up node;

the second output circuit is electrically connected to the pull-up node, a second clock signal terminal and a drive output terminal of the shift register respectively; and the second output circuit is configured to provide a signal of the second clock signal terminal to the drive output terminal of the shift register under control of the pull-up node; and the pull-down circuit is electrically connected to a third power voltage terminal and the pull-down node respectively; and the pull-down circuit is configured to provide a signal of the third power voltage terminal respectively to the cascade output terminal and the drive output terminal under control of the pull-down node.

In some embodiments, in the display substrate provided by the embodiment of the disclosure, one of the second input terminal and the third input terminal of the $n^{th}$-stage shift register is electrically connected to the cascade output terminal of the $(n-y)^{th}$-stage shift register, and the other is electrically connected to the first power voltage terminal or a fourth power voltage terminal.

In some embodiments, in the display substrate provided by the embodiment of the disclosure, the second input terminal and the third input terminal of the $n^{th}$-stage shift register are both electrically connected to the cascade output terminal of the $(n-y)^{th}$-stage shift register.

In some embodiments, in the display substrate provided by the embodiment of the disclosure, the fourth input terminal of the $n^{th}$-stage shift register is electrically connected to a cascade output terminal of a $(n+y)^{th}$-stage shift register.

Correspondingly, an embodiment of the disclosure further provides a detection method for the above-mentioned display substrate, including:

a charging phase: controlling a cascade output terminal of a shift register in each stage to output a valid potential signal, to enable the output control circuit to disconnect a signal transmission with the pull-up node of the corresponding-stage shift register under control of the second control terminal, and to enable the detection input circuit to charge the first capacitor under control of the first control terminal and the first input terminal;

a reset phase: controlling all nodes containing the pull-up node and the cascade output terminal of the shift register in each stage to output invalid potential signals;

a discharging phase: turning on the output control circuit with the pull-up node of the corresponding-stage shift register under control of the second control terminal, and discharging only the first capacitor to the pull-up node; and a detection phase: controlling a drive output terminal of the shift register in each stage to output a valid potential signal, providing a data voltage to at least one data signal line in the display area, detecting a voltage of a pixel electrode corresponding to the data signal line, and determining whether each of the compensation sub-circuits is abnormal.

In some embodiments, in the detection method provided by the embodiment of the disclosure, the charging phase further includes:

controlling the cascade output terminal of the shift register in each stage to output a high-potential signal and the drive output terminal of the shift register in each stage to output a low-potential signal; and loading the high-potential signal to the first control terminal, and loading the low-potential signal to the second control terminal.

In some embodiments, in the detection method provided by the embodiment of the disclosure, after the charging phase ends and before the reset phase, the method further includes: loading a low-potential signal to the first control terminal.

In some embodiments, in the detection method provided by the embodiment of the disclosure, the reset phase further includes:

controlling the cascade output terminal of the shift register in each stage to output a low-potential signal and the drive output terminal of the shift register in each stage to output a low-potential signal.

In some embodiments, in the detection method provided by the embodiment of the disclosure, the discharging phase further includes:

loading a high-potential signal to the second control terminal.

In some embodiments, in the detection method provided by the embodiment of the disclosure, the detection phase further includes:

controlling the drive output terminal of the shift register in each stage to output a high-potential signal.

Correspondingly, an embodiment of the disclosure further provides another detection method for the above-mentioned display substrate, including:

a charging phase: controlling a cascade output terminal of a shift register in each stage to output a valid potential signal, to enable the output control circuit to disconnect a signal transmission with the pull-up node of the corresponding-stage shift register under control of the second control terminal, and to enable the detection input circuit to charge the first capacitor under control of the first control terminal and the first input terminal; and a detection phase: detecting a voltage of the second pole of the first capacitor in each compensation sub-circuit, and determining whether the compensation sub-circuit is abnormal.

In some embodiments, in the detection method provided by the embodiment of the disclosure, the charging phase further includes:

controlling the cascade output terminal of the shift register in each stage to output a high-potential signal and the drive output terminal of the shift register in each stage to output a low-potential signal; and loading the high-potential signal to the first control terminal, and loading the low-potential signal to the second control terminal.

Correspondingly, an embodiment of the disclosure further provides a display apparatus, including any display substrate provided by the embodiments of the disclosure.

In some embodiments, the display apparatus provided by the embodiment of the disclosure further includes: a timing controller configured to:

a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal to enable the output control circuit to disconnect a signal transmission with a pull-up node of a corresponding-stage shift register, and load the low-potential signal to the first control terminal to enable the detection input circuit to charge the first capacitor; and load the low-potential signal to the first control terminal after the charging phase ends;

a reset phase: load a corresponding signal to the shift register in each stage, and control the cascade output terminal of the shift register in each stage to output a low-potential signal and the drive output terminal of the shift register in each stage to output a low-potential signal;

a discharging phase: load a high-potential signal to the second control terminal to turn on the output control circuit with the pull-up node of the corresponding-stage shift register, and discharge only the first capacitor to the pull-up node; and a detection phase: load a corresponding signal to the shift register in each stage, control the drive output terminal of the shift register in each stage to output a high-potential signal, and provide a data voltage to at least one data signal line in the display area, to detect a voltage of a pixel electrode corresponding to the data signal line and determine whether each of the compensation sub-circuits is abnormal.

In some embodiments, the display apparatus provided by the embodiment of the disclosure further includes: a timing controller configured to:

a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal to enable the output control circuit to disconnect a signal transmission with a pull-up node of a corresponding-stage shift register, and load the low-potential signal to the first control terminal to enable the detection input circuit to charge the first capacitor, to detect a voltage of the second pole of the first capacitor in each compensation sub-circuit and determine whether the compensation sub-circuit is abnormal in a subsequent detection phase.

BRIEF DESCRIPTION OF THE DRAWINGS

FIG. 12 is a schematic flowchart of a detection method according to another embodiment of the disclosure.

DETAILED DESCRIPTION OF THE EMBODIMENTS

Figure 13:
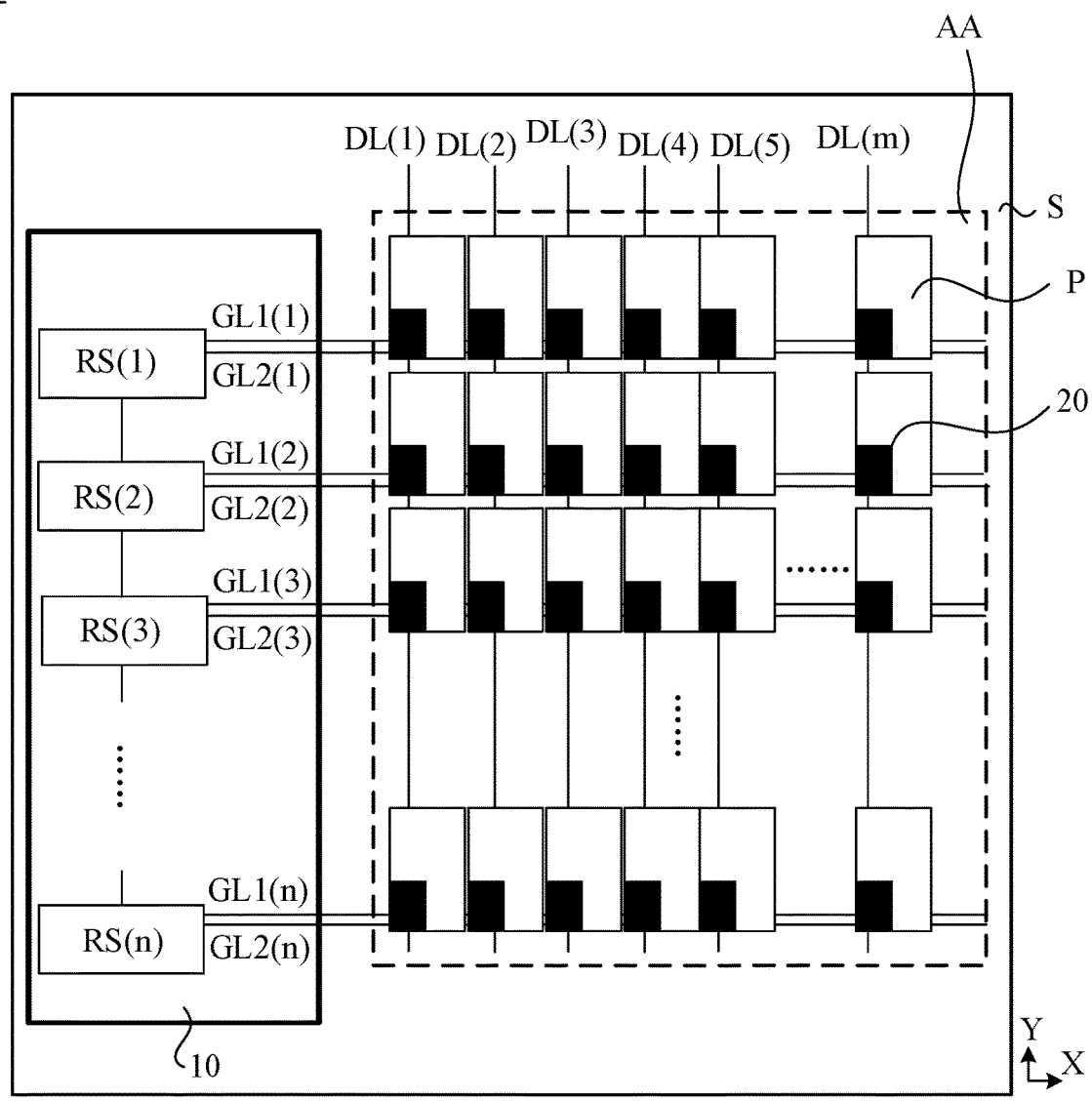
FIG. 13 is a structural diagram of a display substrate according to some embodiments.

An embodiment of the disclosure provides a display apparatus. As shown in FIG. 13, the display apparatus includes a display substrate 100. The display substrate 100 has a display area (Active Area, AA) and at least one peripheral area S around the display area.

As shown in FIG. 13, the display substrate 100 includes a plurality of sub-pixels P disposed in the display area. The plurality of sub-pixels P include at least first color sub-pixels, second color sub-pixels and third color sub-pixels. The first color, the second color and the third color are three primary colors, such as red, green and blue.

It should be noted that the plurality of sub-pixels P are arranged in an array of n rows and m columns as an example for illustration in FIG. 13, but the embodiments of the disclosure are not limited thereto. The plurality of sub-pixels P may also be arranged in other ways. Here, the sub-pixels P arranged as a line in a horizontal direction X are called sub-pixels in the same row, and the sub-pixels P arranged as a line in a vertical direction Y are called sub-pixels in the same column.

In some embodiments, as shown in FIG. 13, the display substrate 100 is provided with a plurality of first scan signal lines GL1(1)-GL1(n), a plurality of second scan signal lines GL2(1)-GL2(n), and a plurality of data signal lines DL(1)-DL(m). Exemplarily, the first scan signal line GL1 and the second scan signal line GL2 extend in the horizontal direction X, and the data signal line DL extends in the vertical direction Y.

In some embodiments, as shown in FIG. 13, the peripheral area S of the display substrate 100 is provided with a gate drive circuit 10. The gate drive circuit 10 includes a plurality of cascaded shift register circuits RS(1)-RS(n). Each shift register circuit RS is coupled to a first scan signal line GL1 and a second scan signal line GL2, and is configured to provide a first scan signal and a second scan signal to the first scan signal line GL1 and the second scan signal line GL2.

In other embodiments, the display apparatus further includes a gate driver. The gate driver is internally integrated with a gate drive circuit and is bonded to an edge of the display substrate 100. The gate drive circuit includes a plurality of cascaded shift register circuits RS(1)-RS(n), where each shift register circuit RS is coupled to a first scan signal line GL1(1)-GL1(n) and a second scan signal lines GL2(1)-GL2(n), and is configured to provide a first scan signal and a second scan signal to the first scan signal line GL1 and the second scan signal line GL2.

It should be noted that the embodiments of the disclosure are described by taking the gate drive circuit disposed in the peripheral area S of the display substrate 100, i.e., a GOA (Gate Driver on Array) circuit, as an example.

Figure 14:
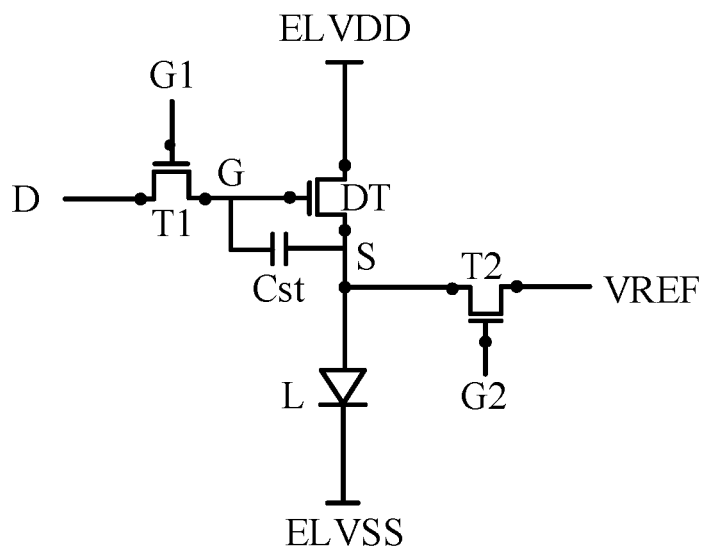
FIG. 14 is a structural diagram of a pixel drive circuit according to some embodiments.

In some embodiments, as shown in FIG. 13, each sub-pixel P is provided with a pixel drive circuit 20. As shown in FIG. 14, the pixel drive circuit 20 is coupled to a light emitting device L, and is configured to drive the light emitting device L to emit light.

Exemplarily, the light emitting device L includes an OLED (Organic Light-Emitting Diode) or a QLED (Quantum Dot Light Emitting Diode).

Exemplarily, as shown in FIG. 14, the pixel drive circuit 20 includes a storage capacitor Cst, a first switch transistor T1, a second switch transistor T2 and a drive transistor DT.

A control pole of the first switch transistor T1 is coupled to the first scan signal terminal G1, a first pole of the first switch transistor T1 is coupled to a data signal terminal D, and a second pole of the first switch transistor T1 is coupled to a control pole G of the drive transistor DT. A control pole of the second switch transistor T2 is coupled to a second scan signal terminal G2, a first pole of the second switch transistor T2 is coupled to a reference signal terminal VREF, and a second pole of the second switch transistor T2 is coupled to a second pole S of the drive transistor DT. A first pole of the drive transistor DT is coupled to a first power signal terminal ELVDD. One terminal of the storage capacitor Cst is coupled to the control pole G of the drive transistor DT, and the other terminal is coupled to the second pole S of the drive transistor DT.

A first pole of the light emitting device L is coupled to the second pole S of the drive transistor DT, and a second pole of the light emitting device L is coupled to a second power signal terminal ELVSS.

Here, the first scan signal line GL1 is configured to provide a first scan signal to the first scan signal terminal G1, the second scan signal line GL2 is configured to provide a second scan signal to the second scan signal terminal G2, and the data signal line DL is configured to provide a data signal to the data signal terminal D.

It should be noted that all transistors in the embodiments of the disclosure may be either P-type transistors or N-type transistors. For convenience, the N-type transistor is taken as an example for description below.

Figure 15:
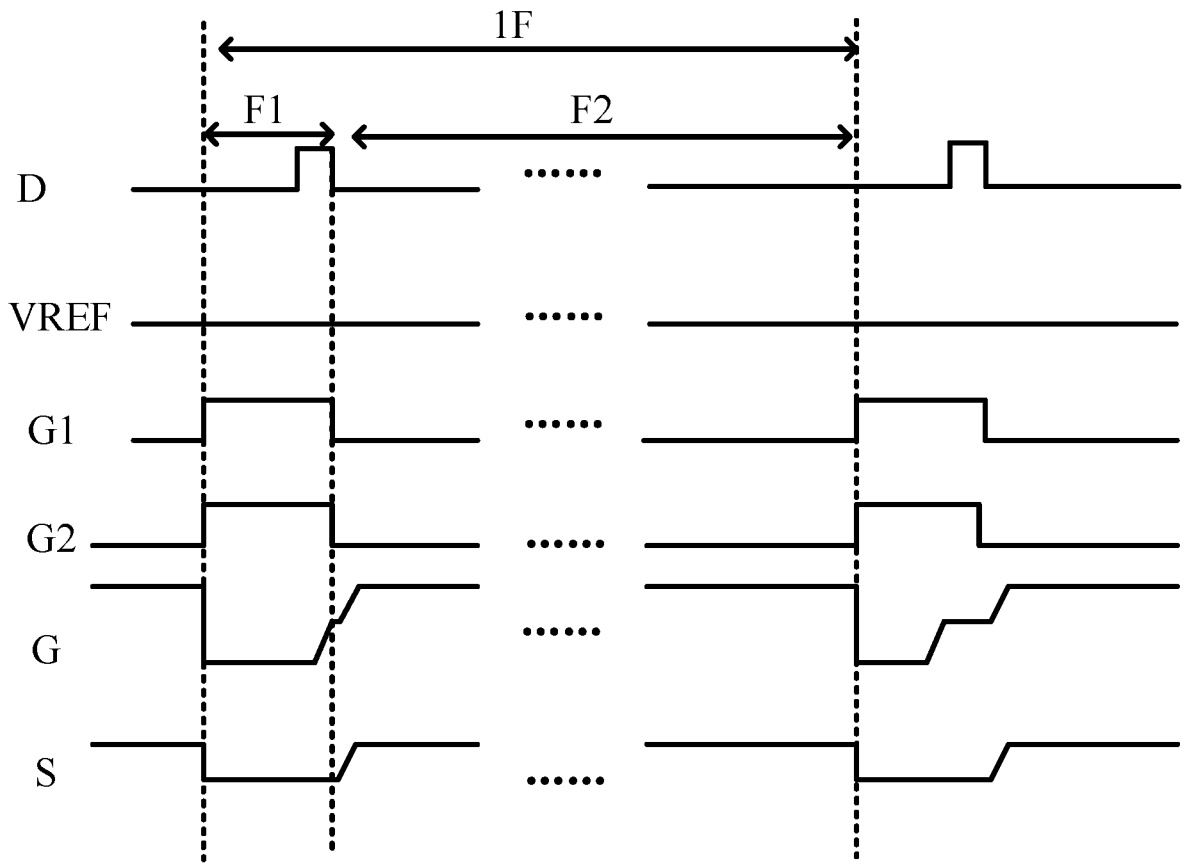
FIG. 15 is a timing diagram based on the pixel drive circuit of FIG. 14 in the related art.

In the related art, as shown in FIGS. 14 and 15, the process in which the pixel drive circuit 20 drives the light emitting device L to emit light includes a data writing phase F1 and a light emitting phase F2.

In the data writing phase F1, the first scan signal line GL1 provides a first scan signal at a high potential to the first scan signal terminal G1, and the first switch transistor T1 is turned on to write a data signal provided by the data signal terminal D into the control pole G of the drive transistor DT; and at the same time, the second scan signal line GL2 provides a second scan signal at a high potential to the second scan signal terminal G2, and the second switch transistor T2 is turned on to write a reference signal provided by the reference signal terminal VREF into the second pole S of the drive transistor DT.

In the light emitting phase F2, the first scan signal provided by the first scan signal line GL1 to the first scan signal terminal G1 and the second scan signal provided by the second scan signal line GL2 to the second scan signal terminal G2 are both at low potentials, and the first switch transistor T1 and the second switch transistor T2 are turned off. Under the action of the high potential of the control pole G of the drive transistor DT, the drive transistor DT is turned on to transmit a first power signal provided by the first power signal terminal ELVDD to the second pole S of the drive transistor DT. At this time, due to the bootstrapping function of the storage capacitor Cst, the potential of the control pole G of the drive transistor DT is further pulled up, and the drive transistor DT continues to be turned on and drives the light emitting device L to emit light.

That is, a general gate drive circuit is composed of a plurality of cascaded shift registers, the drive signal output terminal of the shift register in each stage is electrically connected to at least one scan signal line, and the scan signals are input to the scan signal lines on the display panel in turn through the shift registers in all the stages. In the liquid crystal display panel, the scan signal line in each row is electrically connected to the gates of the display transistors configured to control the charging of the pixel electrodes in the display panel, and controls whether to turn on these display transistors to control whether to charge the pixel electrodes.

When the display substrate is detected, it is necessary to perform the row-by-row detection and random row detection. However, the current gate drive circuit only has the function of row-by-row detection and cannot realize the random detection.

In order to make the above-mentioned objects, features and advantages of the disclosure more apparent, the disclosure will be further illustrated below in combination with the drawings and embodiments. However, the exemplary embodiments can be implemented in various forms and should not be understood as being limited to the embodiments illustrated here; and on the contrary, these embodiments are provided to make the disclosure more comprehensive and complete, and the concept of the exemplary embodiments is fully conveyed to those skilled in the art. The same reference numbers represent the same or similar structures in the figures, so the repeated description thereof will be omitted. The words expressing the positions and directions described in the disclosure are all intended to illustrate by taking the drawings as examples, but can also be changed as needed, where the changes made are all contained in the protection scope of the disclosure. The drawings of the disclosure are merely configured to illustrate the relative position relationship, but not represent the real proportion.

It is necessary to note that the specific details are illustrated in the following description so as to fully understand the disclosure. But the disclosure can be implemented in many other ways different from that described here, and those skilled in the art can make the similar modifications without violating the connotation of the disclosure. Thus the disclosure is not limited by the specific embodiments disclosed below. The following description of the specification is the preferred embodiments implementing the disclosure, but the said description is for the purpose of illustrating the general principle of the disclosure, and not intended to limit the scope of the disclosure. The protection scope of the disclosure should be limited by the attached claims.

The display substrate, the detection method therefor and the display apparatus provided by the embodiments of the disclosure will be described in detail below with reference to the accompanying drawings.

Figure 1:
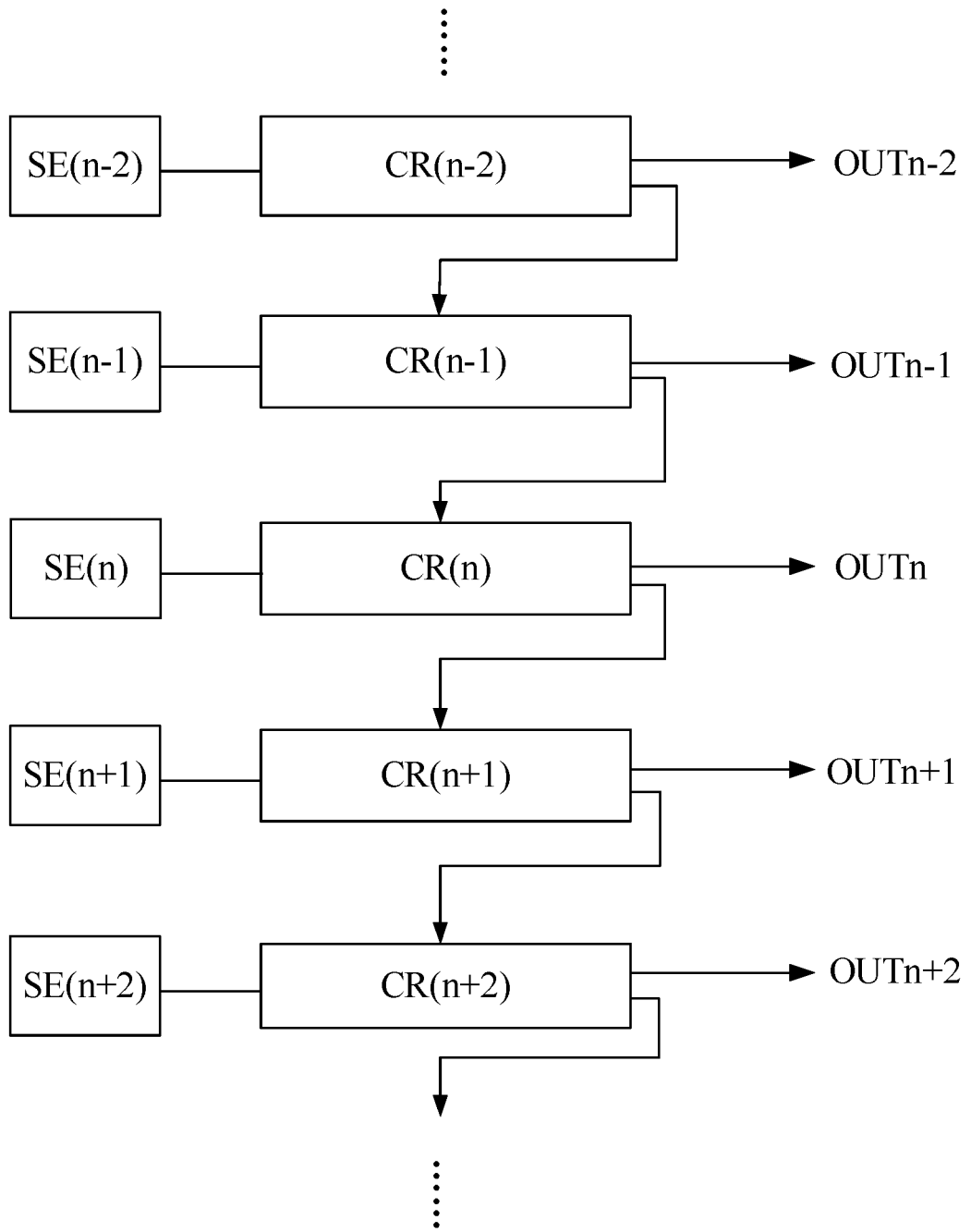
FIG. 1 is a structural schematic diagram of a gate drive circuit in a display substrate according to an embodiment of the disclosure.
Figure 2:
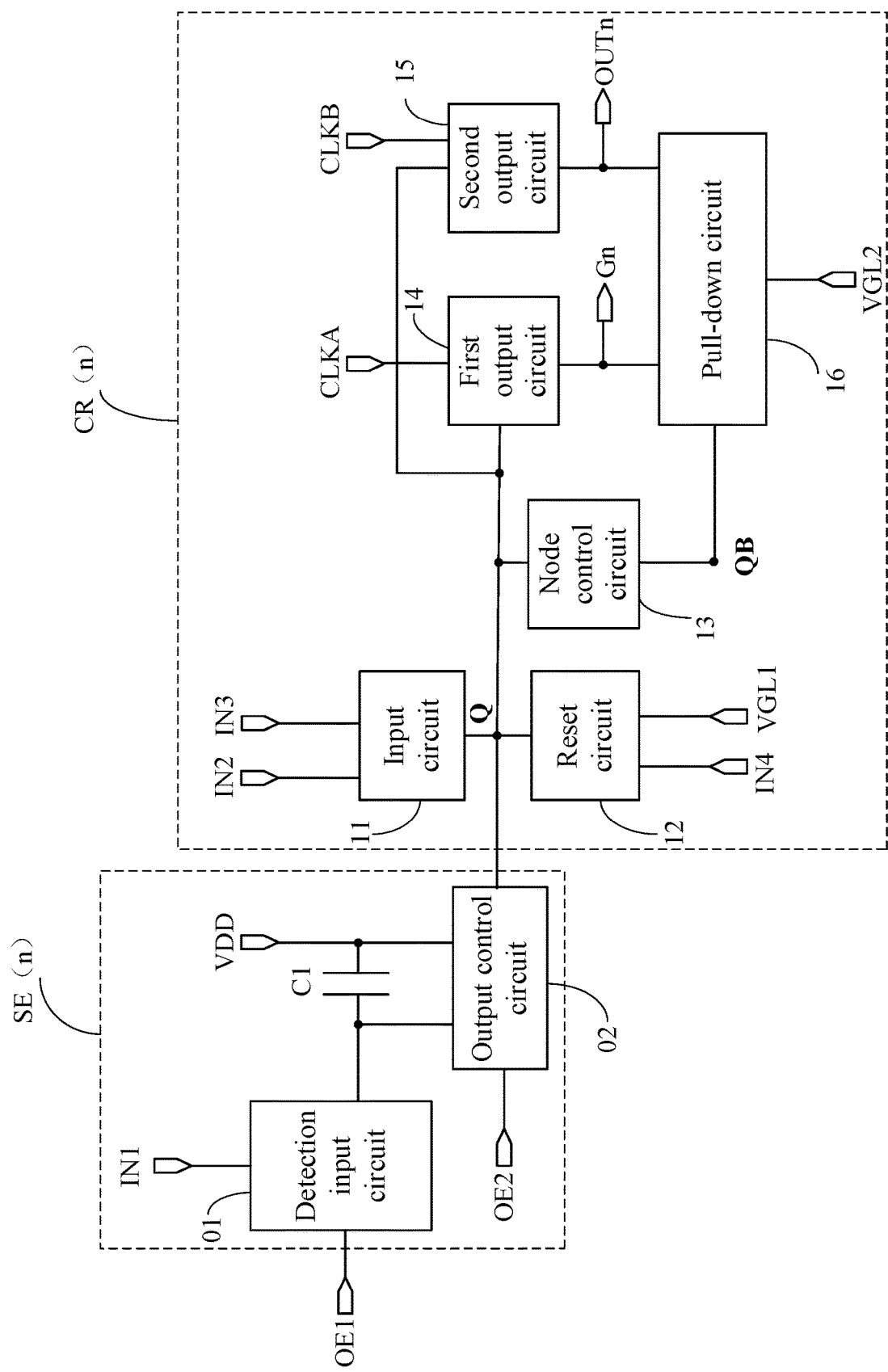
FIG. 2 is a schematic diagram of a partial structure of the gate drive circuit in the display substrate according to an embodiment of the disclosure.

An embodiment of the disclosure provides a display substrate. The display substrate has a display area and a frame area. The frame area is provided with a gate drive circuit. As shown in FIG. 1, the gate drive circuit includes a plurality of shift registers CR(n) cascaded on a base substrate and compensation sub-circuits SE(n) in one-to-one correspondence to the shift registers CR(n). As shown in FIG. 2, each compensation sub-circuit SE(n) includes: a detection input circuit 01, a first capacitor C1 and an output control circuit 02; wherein:

the detection input circuit 01 is electrically connected to a first control terminal OE1, a first input terminal IN1, and first and second poles of the first capacitor C1 respectively; and the detection input circuit 01 is configured to charge the first capacitor C1 under control of the first control terminal OE1 and the first input terminal IN1;

the second pole of the first capacitor C1 is electrically connected to a first power voltage terminal VDD;

the output control circuit 02 is electrically connected to a second control terminal OE2, the first pole of the first capacitor C1, the first power voltage terminal VDD, and a pull-up node Q of a corresponding-stage shift register CR(n) respectively, and the output control circuit is configured to provide a signal of the first power voltage terminal VDD to the pull-up node Q of the corresponding-stage shift register CR(n) under control of the second control terminal OE2 and the first capacitor C1;

wherein a first input terminal IN1 of the compensation sub-circuit SE(n) corresponding to a $n^{th}$-stage shift register CR(n) is electrically connected to a cascade output terminal G(n−y) of a (n−y)$^{th}$-stage shift register CR(n−y).

In the display substrate provided by the embodiments of the disclosure, the compensation sub-circuits in one-to-one correspondence to the shift registers in all stages are arranged in the gate drive circuit; wherein the compensation sub-circuit includes a detection input circuit, a first capacitor and an output control circuit; when the shift register in each stage outputs a signal, the first capacitor in each compensation sub-circuit is charged under the control of the detection input circuit, and the compensation sub-circuit is disconnected from the pull-up node of the shift register in the corresponding stage through the output control circuit, to prevent the compensation sub-circuit from affecting the output of the shift register. When the output of the shift register in each stage is completed, the shift register in each stage stops being triggered, and the output control circuit provides the signal of the first power voltage terminal to the pull-up node of the shift register in the corresponding stage under the control of the second control terminal and the first capacitor, so as to use the compensation sub-circuit to control the output to the shift register in the corresponding stage. The output control circuit in each compensation sub-circuit can be controlled independently, so the addition of the compensation sub-circuits can realize the function of row-by-row detection or random row detection.

The disclosure will be described in detail below with reference to specific embodiments. It should be noted that this embodiment is intended for better explanation of the disclosure but does not limit the disclosure.

Figure 3:
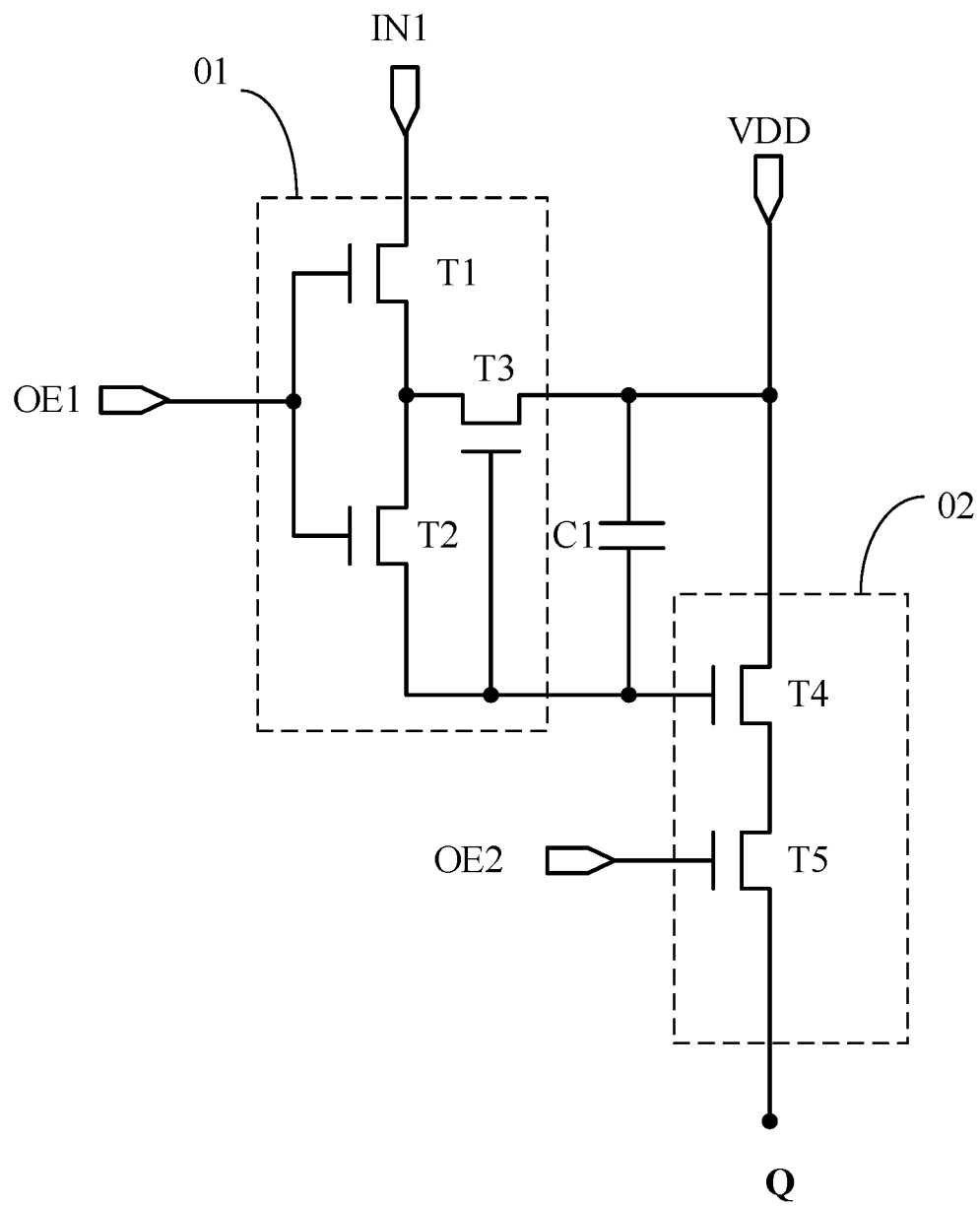
FIG. 3 is a structural schematic diagram of a compensation sub-circuit according to an embodiment of the disclosure.

Optionally, in the display substrate provided by the embodiment of the disclosure, as shown in FIG. 3, the detection input circuit 01 may include: a first transistor T1, a second transistor T2 and a third transistor T3; wherein:

a gate of the first transistor T1 is electrically connected to the first control terminal OE1, a first pole of the first transistor T1 is electrically connected to the first input terminal IN1, and a second pole of the first transistor T1 is electrically connected to a first pole of the second transistor T2 and a first pole of the third transistor T3 respectively;

a gate of the second transistor T2 is electrically connected to the first control terminal OE1, and a second pole of the second transistor T2 is electrically connected to the first pole of the first capacitor C1 and a gate of the third transistor T3 respectively;

a second pole of the third transistor T3 is electrically connected to the second pole of the first capacitor C1.

In a specific implementation, when the first control terminal OE1 controls the first transistor T1 and the second transistor T2 to be turned on, the signal of the first input terminal IN1 charges the first capacitor C1 through the first transistor T1 and the second transistor T2.

Optionally, in the display substrate provided by the embodiment of the disclosure, as shown in FIG. 3, the output control circuit 02 may include: a fourth transistor T4 and a fifth transistor T5; wherein:

a gate of the fourth transistor T4 is electrically connected to the first pole of the first capacitor C1, a first pole of the fourth transistor T4 is electrically connected to the first power voltage terminal VDD, and a second pole of the fourth transistor T4 is electrically connected to a first pole of the fifth transistor T5;

a gate of the fifth transistor T5 is electrically connected to the second control terminal OE2, and a second pole of the fifth transistor T5 is electrically connected to the pull-up node Q of the corresponding-stage shift register CR(n).

In a specific implementation, when the voltage of the first pole of the first capacitor is charged to be greater than the turn-on voltage of the gate of the fourth transistor, the fourth transistor is turned on, and the signal of the first power voltage terminal is provided to the fifth transistor through the fourth transistor; when the second control terminal controls the fifth transistor to be turned on, the voltage output by the fourth transistor is provided to the pull-up node of the shift register through the fifth transistor, and the scanning function of the scan signal line can be realized by controlling the pull-up node.

The above is only an example of the specific structures of the detection input circuit and the output control circuit in the compensation sub-circuit. In a specific implementation, the specific structures of the detection input circuit and the output control circuit are not limited to the above structures provided by the embodiments of the disclosure and may also be other structures known to those skilled in the art, which are not limited here.

It should be noted that, in a specific implementation, the structure of the shift register is not limited in the gate drive circuit provided by the embodiments of the disclosure, as long as it is ensured that the shift register has a structure with a pull-up node and a pull-down node. Furthermore, the cascading relationship of shift registers is not limited. They can be cascaded sequentially, for example, the $n^{th}$ stage is cascaded with the $(n+1)^{th}$ stage. Of course, they can also be cascaded in an interval, for example, the $n^{th}$ stage is cascaded with the $(n+x)^{th}$ stage, where x is an integer greater than 1.

The shift register provided by the embodiments of the disclosure will be briefly described below with a specific embodiment.

Optionally, in the display substrate provided by the embodiments of the disclosure, as shown in FIG. 2, the shift register may include: an input circuit 11, a reset circuit 12, a node control circuit 13, a first output circuit 14, a second output circuit 15 and a pull-down circuit 16; in the $n^{th}$-stage shift register CR(n):

the input circuit 11 is electrically connected to a second input terminal IN2, a third input terminal IN3 and a pull-up node Q respectively; and the input circuit 11 is configured to provide a signal of the third input terminal IN3 to the pull-up node Q under control of the second input terminal IN2;

the reset circuit 12 is electrically connected to a fourth input terminal IN4, a second power voltage terminal VGL1 and the pull-up node Q respectively; and the reset circuit 12 is configured to provide a signal of the second power voltage terminal VGL1 to the pull-up node Q under control of the fourth input terminal IN4;

the node control circuit 13 is electrically connected to the pull-up node Q and a pull-down node QB respectively; and the node control circuit 13 is configured to make potentials of the pull-up node Q and the pull-down node QB opposite to each other;

the first output circuit 14 is electrically connected to the pull-up node Q, a first clock signal terminal CLKA and a cascade output terminal Gn of the shift register CR(n) respectively; and the first output circuit 14 is configured to provide a signal of the first clock signal terminal CLKA to the cascade output terminal Gn of the shift register CR(n) under control of the pull-up node Q;

the second output circuit 15 is electrically connected to the pull-up node, a second clock signal terminal CLKB and a drive output terminal OUTn of the shift register CR(n) respectively; and the second output circuit is configured to provide a signal of the second clock signal terminal to the drive output terminal OUTn of the shift register CR(n) under control of the pull-up node;

the pull-down circuit 16 is electrically connected to a third power voltage terminal VGL2 and the pull-down node QB respectively; and the pull-down circuit 16 is configured to provide a signal of the third power voltage terminal VGL2 respectively to the cascade output terminal Gn and the drive output terminal under control of the pull-down node QB.

Further, in a specific implementation, one of the second input terminal and the third input terminal of the $n^{th}$-stage shift register is electrically connected to the cascade output terminal of the $(n-y)^{th}$-stage shift register, and the other is electrically connected to the first power voltage terminal or a fourth power voltage terminal VGH1, or both the second input terminal and the third input terminal of the $n^{th}$-stage shift register are electrically connected to the cascade output terminal of the $(n-y)^{th}$-stage shift register, which is not limited here, wherein y is an integer greater than or equal to 1.

In a specific implementation, the fourth input terminal of the $n^{th}$-stage shift register is generally electrically connected to the cascade output terminal of the $(n+y)^{th}$-stage shift register.

Further, in a specific implementation, the shift register may be provided with a plurality of second output circuits, where each second output circuit corresponds to a drive output terminal, and each drive output terminal is electrically connected to a first scan signal line, which is not limited here. The cascade output terminal of the shift register is connected to a second scan signal line.

In a specific implementation, in the shift register provided by the embodiment of the disclosure, each circuit may generally be composed of one or more transistors, and the specific structure of each circuit is not limited in the disclosure.

Figure 4:
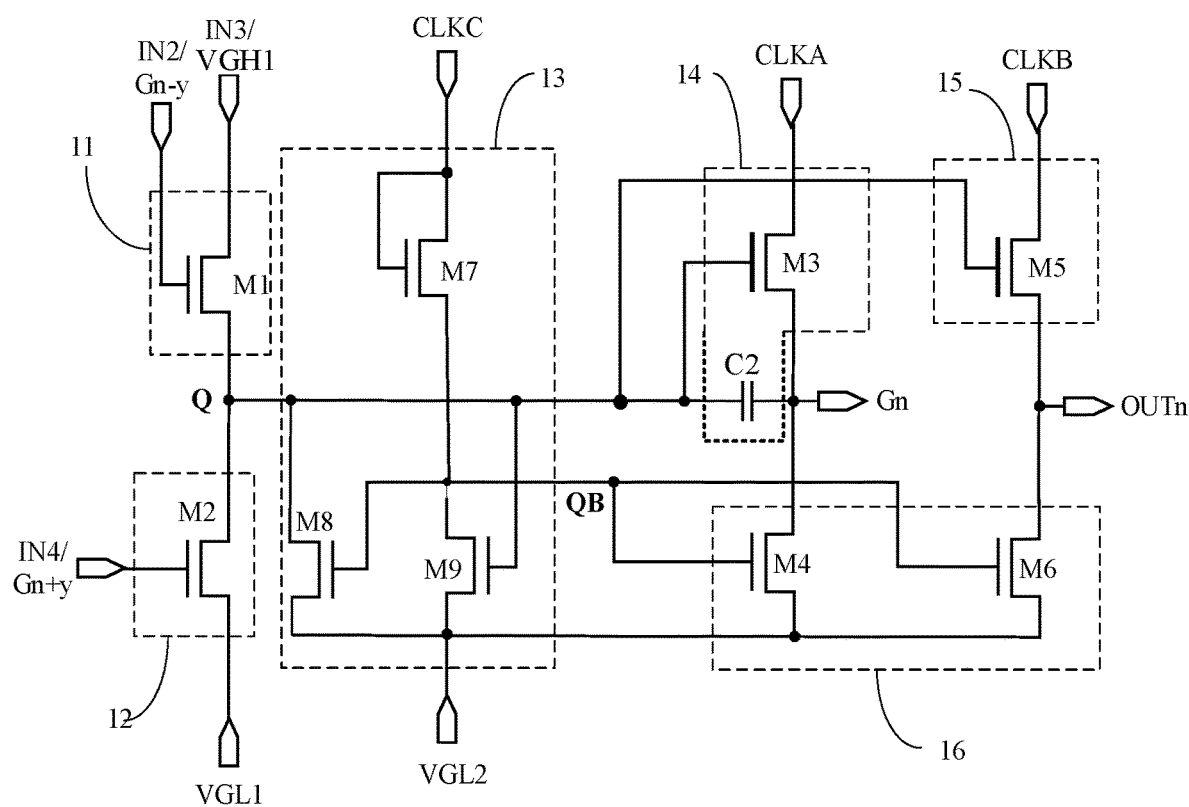
FIG. 4 is a structural schematic diagram of a shift register according to an embodiment of the disclosure.
Figure 5:
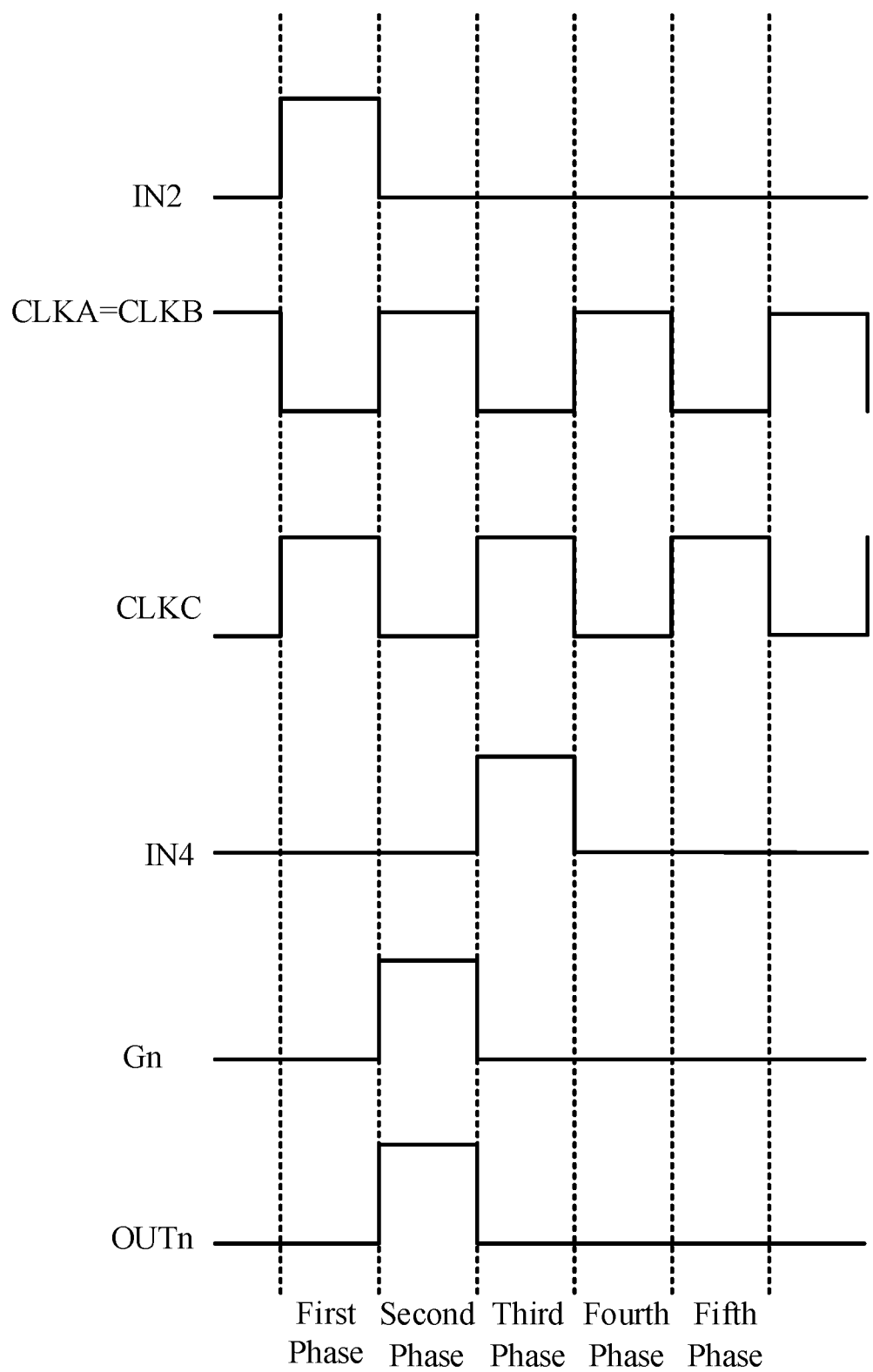
FIG. 5 is a circuit timing diagram corresponding to the shift register shown in FIG. 4.

In some embodiments, the specific structure of the shift register is as shown in FIG. 4. The input circuit 11 may include a transistor M1; the reset circuit 12 includes a transistor M2; the node control circuit 13 includes a transistor M7, a transistor M8 and a transistor M9; the first output circuit 14 includes a transistor M3 and a second capacitor C2; the second output circuit 15 includes a transistor M5; and the pull-down circuit 16 includes a transistor M4 and a transistor M6. The specific connection relationship of the transistors M1-M9 is shown in FIG. 4, and the corresponding timing diagram during normal operation is shown in FIG. 5.

Specifically, in the first phase, IN2=1, CLKA=CLKB=0, CLKC=1, IN4=0. The transistor M1 is turned on, the potential of the pull-up node Q is high, and the transistor M3, the transistor M5 and the transistor M9 are turned on; since CLKC=1, the transistor M7 is turned on; since the transistor M7 and the transistor M9 are both turned on, the potential of the pull-down node QB is low; since the transistor M3 and the transistor M5 are turned on and CLKA=CLKB=0, the cascade output terminal Gn and the drive output terminal OUTn both output low-potential signals.

In the second phase, IN2=0, CLKA=CLKB=1, CLKC=0, IN4=0. Since CLKA=1, the potential of the pull-up node Q is further pulled up, and the transistor M3, the transistor M5 and the ninth switch transistor M9 are turned on; since the transistor M9 is turned on, the potential of the pull-down node QB is low; since the transistor M3 and the transistor M5 are turned on and CLKA=CLKB=1, the cascade output terminal Gn and the drive output terminal OUTn both output high-potential signals.

In the third phase, IN2=0, CLKA=CLKB=0, CLKC=1, IN4=1. Since IN4=1, the transistor M2 is turned on, and the potential of the pull-up node Q is low; since CLKC=1, the transistor M7 is turned on, the potential of the pull-down node QB is high, and the transistor M4, the transistor M6 and the transistor M8 are turned on; since the transistor M8 is turned on, the potential of the pull-up node Q is further guaranteed to be low; since the transistor M4 and the transistor M6 are turned on, the cascade output terminal Gn and the drive output terminal OUTn both output low-potential signals.

In the fourth phase, IN2=0, CLKA=CLKB=1, CLKC=0, IN4=0. The potential of the pull-up node Q is low, the potential of the pull-down node QB is still high, and the transistor M4, the transistor M6 and the transistor M8 are turned on; since the transistor M8 is turned on, the potential of the pull-up node Q is further guaranteed to be low; since the transistor M4 and the transistor M6 are turned on, the cascade output terminal Gn and the drive output terminal OUTn both output low-potential signals.

In the fifth phase, IN2=0, CLKA=CLKB=0, CLKC=1, IN4=0. Since CLKC=1, the transistor M7 is turned on, the potential of the pull-down node QB is high, and the transistor M4, transistor M6 and transistor M8 are turned on; since the transistor M8 is turned on, the potential of the pull-up node Q is low; since the transistor M4 and the transistor M6 are turned on, and the cascade output terminal Gn and the drive output terminal OUTn both output low-potential signals.

After that, the fourth and fifth phases are cycled until the next frame begins.

It should be noted that any transistor mentioned in the above embodiments of the disclosure may be a Thin Film Transistor (TFT) or a Metal Oxide Semiconductor (MOS) field effect transistor, which is not limited here. In a specific implementation, the functions of the sources and drains of these transistors may be interchanged according to the transistor type and input signals, and no specific distinction is made here.

Figure 6:
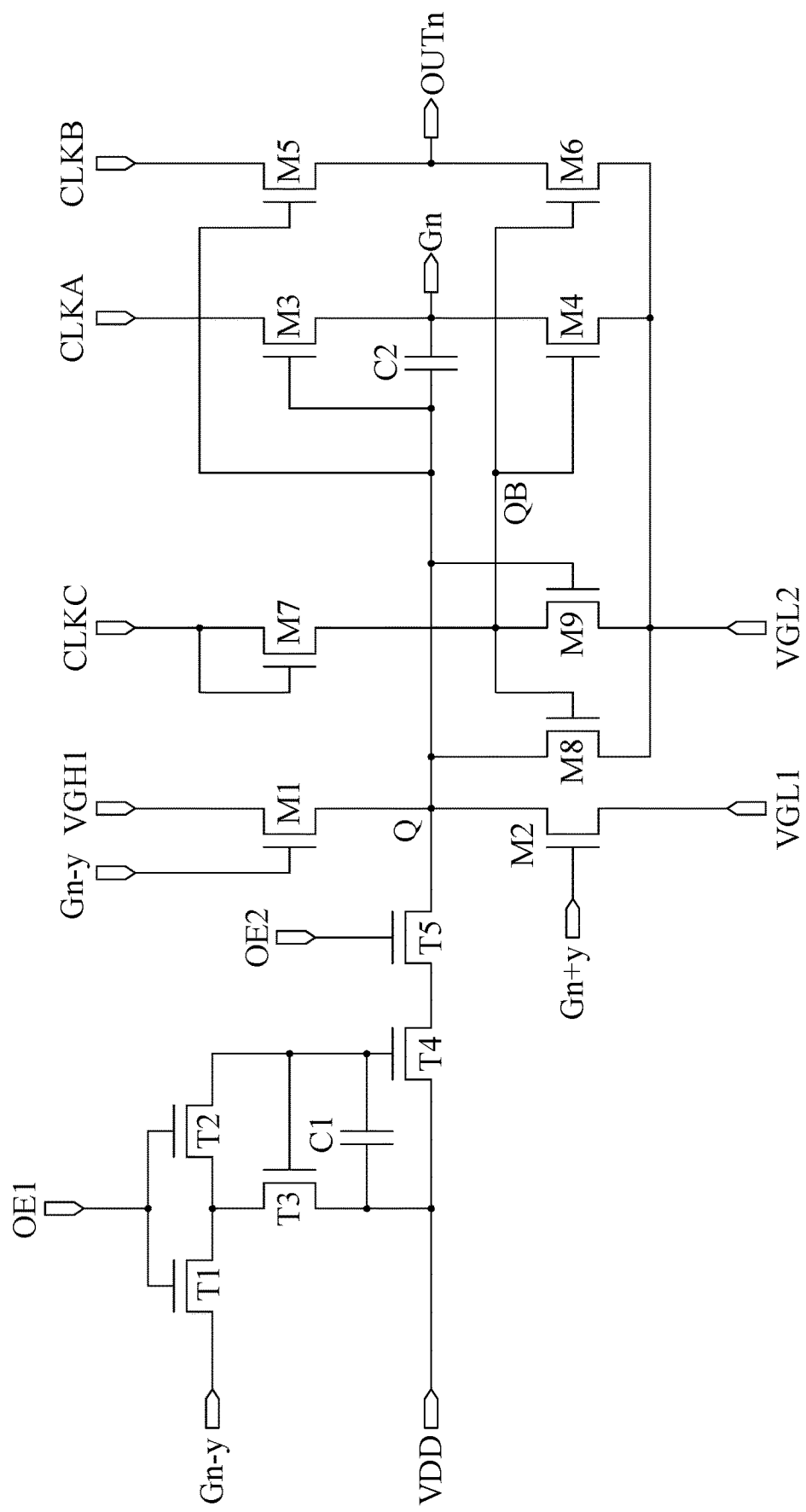
FIG. 6 is a circuit structure diagram of a shift register and a compensation sub-circuit in a gate region circuit according to an embodiment of the disclosure.
Figure 7:
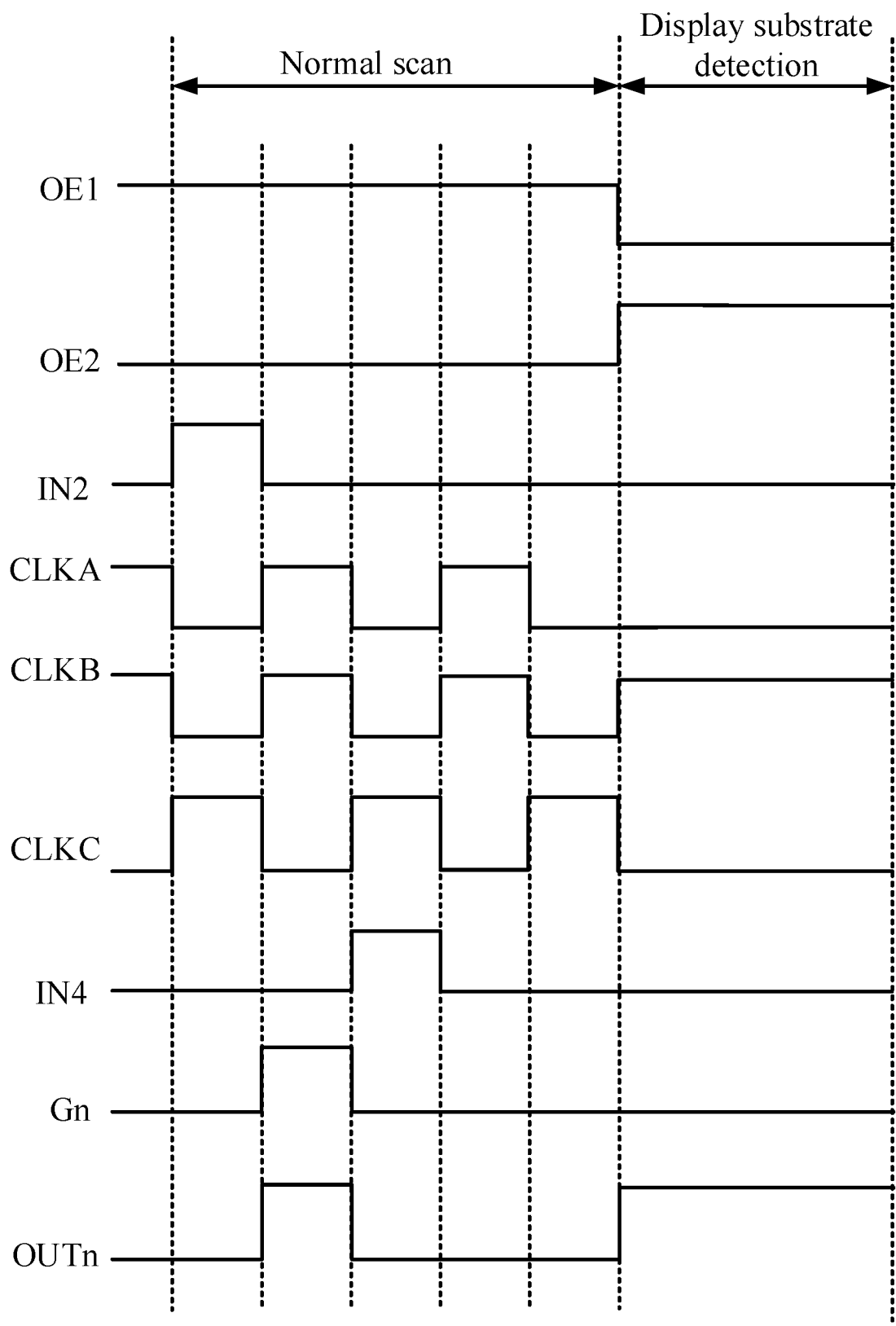
FIG. 7 is a circuit timing diagram corresponding to the circuit shown in FIG. 6.

Further, as shown in FIG. 6, the working principle of the compensation sub-circuit provided by the embodiment of the disclosure will be described with reference to the shift register shown in FIG. 4. Specifically, the corresponding timing diagram is as shown in FIG. 7.

Specifically, when the shift units in all stages perform the normal scanning operation, OE=1 and OE2=0. The fifth transistor T5 is turned off, the compensation sub-circuit is disconnected from the shift register, and there is no signal transmission between the compensation sub-circuit and the shift register, so the compensation sub-circuit will not affect the normal operation of the shift register. In the compensation sub-circuit, the first transistor T1 and the second transistor T2 are turned on. When the cascade output terminal G(n−y) of the (n−y)$^{th}$-stage shift register outputs a high-potential signal, the first capacitor C1 begins to be charged, and then the first power voltage terminal VDD maintains the potential of the second pole of the first capacitor C1.

When the display substrate detection is performed, OE=0 and OE2=1. The first transistor T1 and the second transistor T2 are turned off, the fifth transistor T5 is turned on, and at the same time the first capacitor C1 begins to discharge, the fourth transistor T4 is turned on, and the signal of the first power voltage terminal VDD is transmitted to the pull-up node Q of the corresponding-stage shift register. The first clock signal terminal CLKA=0, and the cascade output terminal Gn outputs a low-potential signal to avoid triggering shift registers in other stages; the second clock signal terminal CLKB=1, and the drive output terminal OUTn outputs a high-potential signal to drive the first scan signal line in the corresponding row.

Since each compensation sub-circuit can be controlled independently, the random row detection of pixels in the display area can be realized.

In a specific implementation, since each of the shift registers and compensation sub-circuits includes a plurality of transistors with different channel width-to-length ratios, the structure is complex, and the abnormality of any transistor or cross line will cause the display abnormality inside the display panel and even some areas cannot be displayed. However, the current test of the display substrate can only detect the shift register. For the compensation sub-circuit, if the compensation sub-circuit is abnormal but it is not detected, the display surface with the abnormal compensation sub-circuit will be fabricated by subsequent processes, thereby wasting the manpower and material resources, and thus resulting in the increased production cost.

Figure 8A:
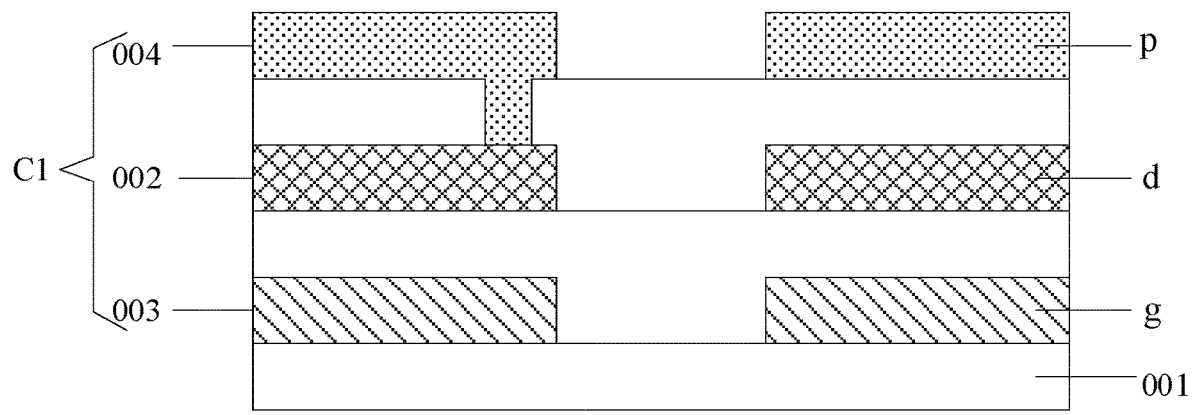
FIG. 8A is a structural schematic diagram of a first capacitor according to an embodiment of the disclosure.
Figure 9A:
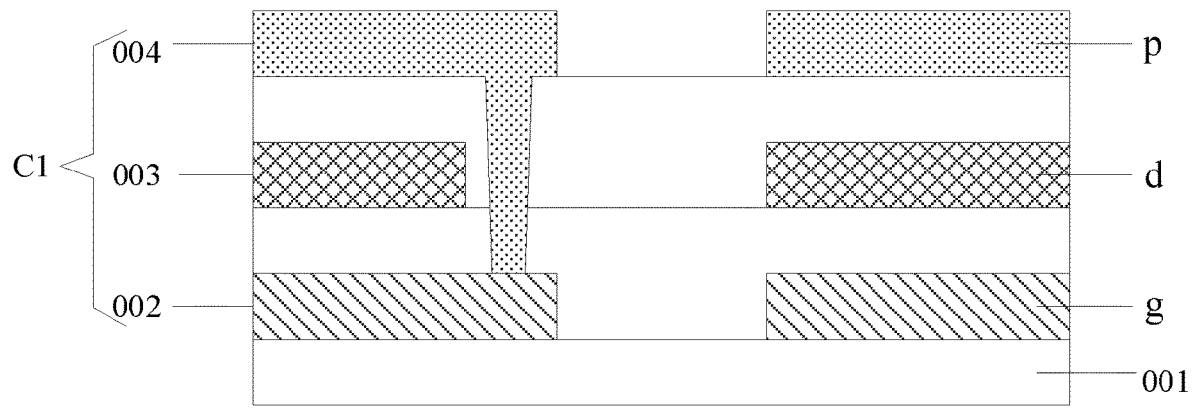
FIG. 9A is a structural schematic diagram of a first capacitor according to another embodiment of the disclosure.

Therefore, optionally, in the display substrate provided by the embodiments of the disclosure, in order to realize the detection of the compensation sub-circuit, as shown in FIG. 8A and FIG. 9A, the display area AA includes a pixel electrode p.

The second pole of the first capacitor C1 includes a transparent conductive electrode 004 disposed in a same layer as the pixel electrode p. Since the current detection device of the display substrate can only perform the voltage detection on the film layer on the surface of the display substrate, the second pole of the first capacitor C1 is set as the transparent conductive electrode 004 disposed in the same layer as the pixel electrode p in the embodiment of the disclosure, so that the voltage detection is performed on the second pole of the first capacitor C1, so as to detect whether the compensation sub-circuit is abnormal.

In some embodiments, as shown in FIG. 8A and FIG. 9A, the second pole of the first capacitor C1 further includes a first metal electrode 002 electrically connected to the transparent conductive electrode 004.

The first pole of the first capacitor C1 includes a second metal electrode 003.

The first metal electrode 002, the second metal electrode 003 and the transparent conductive electrode 004 are disposed in different layers, and the first metal electrode 002 and the second metal electrode 003 are both located between the transparent conductive electrode 004 and the base substrate 001.

In a specific implementation, the transparent conductive electrode 004 is electrically connected to the first metal electrode 002 through a via hole.

Further, the display substrate is generally provided with a plurality of metal layers, such as a data signal line, a scan signal line and a storage capacitor electrode located in the display area. In order to simplify the manufacturing process and reduce the production cost, the first metal electrode and the metal layers of the display area may be set to be in the same layer and of the same material.

Figure 8B:
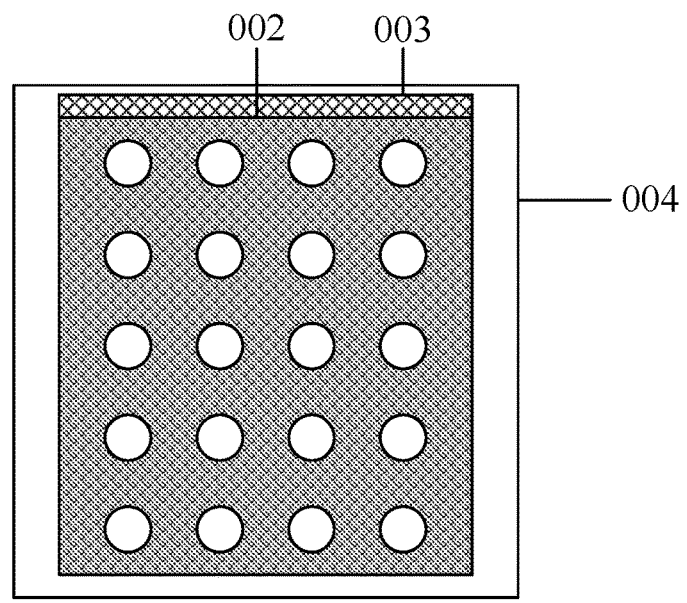
FIG. 8B is a schematic top view corresponding to FIG. 8A.

Optionally, in the display substrate provided by the embodiment of the disclosure, as shown in FIG. 8A, the first metal electrode 002 is arranged in the same layer as the data signal line d, and the second metal electrode 003 is arranged in the same layer as the scan signal line g. At this time, the second metal electrode 003 is disposed below the first metal electrode 002. Therefore, as shown in FIG. 8B, the first metal electrode 002 and the transparent conductive electrode 004 may be electrically connected through a plurality of via holes (indicated by circles in the figure).

Figure 9B:
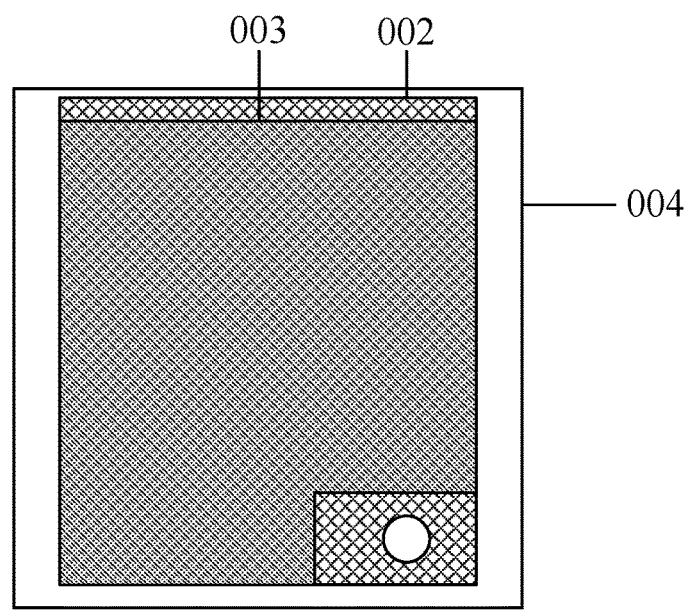
FIG. 9B is a schematic top view corresponding to FIG. 9A.

Alternatively, as shown in FIG. 9A, the first metal electrode 002 is arranged in the same layer as the scan signal line g, and the second metal electrode 003 is arranged in the same layer as the data signal line d. At this time, the second metal electrode 003 is disposed between the first metal electrode 002 and the transparent conductive electrode 004. Therefore, as shown in FIG. 9B, the first metal electrode 002 and the transparent conductive electrode 004 may be electrically connected through a via hole (indicated by a circle in the figure) penetrating through the second metal electrode 003.

Figure 10:
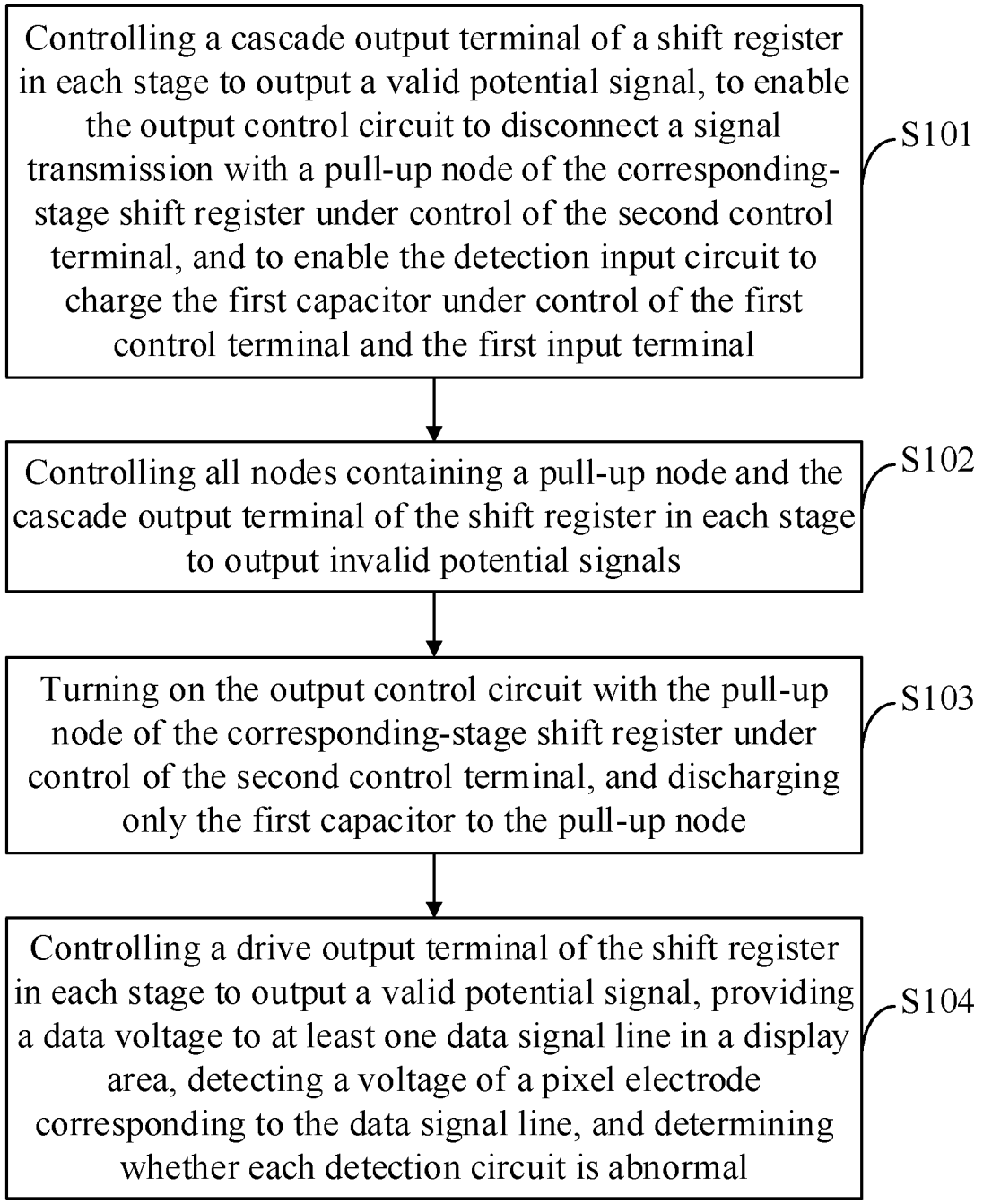
FIG. 10 is a schematic flowchart of a detection method according to an embodiment of the disclosure.

Based on the same inventive concept, an embodiment of the disclosure further provides a detection method for any above-mentioned display substrate. As shown in FIG. 10, the detection method includes S101-S104.

S101. A charging phase: controlling a cascade output terminal of a shift register in each stage to output a valid potential signal, to enable the output control circuit to disconnect a signal transmission with a pull-up node of the corresponding-stage shift register under control of the second control terminal, and to enable the detection input circuit to charge the first capacitor under control of the first control terminal and the first input terminal.

S102. A reset phase: controlling all nodes containing a pull-up node and the cascade output terminal of the shift register in each stage to output invalid potential signals.

S103. A discharging phase: turning on the output control circuit with the pull-up node of the corresponding-stage shift register under control of the second control terminal, and discharging only the first capacitor to the pull-up node.

S104. A detection phase: controlling a drive output terminal of the shift register in each stage to output a valid potential signal, providing a data voltage to at least one data signal line in a display area, detecting a voltage of a pixel electrode corresponding to the data signal line, and determining whether each compensation sub-circuit is abnormal.

In a specific implementation, when the compensation sub-circuit is normal, the first capacitor in the compensation sub-circuit is charged in the charging phase and will be discharged in the detection phase, so that the signal of the first power voltage terminal is provided to the pull-up node of the corresponding-stage shift register, and the pull-up node controls the drive output terminal to output a high-potential signal to each scan signal line corresponding to the display area. At this time, if a data voltage is provided to the data signal line, the data voltage will be transmitted to the pixel electrode electrically connected to the data signal line in this row, to thereby detect the voltage of the pixel electrode corresponding to the data signal line. If the voltage on the pixel electrode is this data voltage, it proves that the compensation sub-circuit in the corresponding row is normal. If the voltage on the pixel electrode is not this data voltage, it proves that the compensation sub-circuit in the corresponding row is abnormal.

Therefore, the above-mentioned detection method provided by the embodiment of the disclosure can perform the fault detection on each compensation sub-circuit in the gate drive circuit. This has the great significance for the detection and fault interception of the display substrate, and prevents the cost loss caused by the subsequent process after missed detection.

The foregoing detection method provided by the embodiment of the disclosure will be described in detail below with reference to the structures of the compensation sub-circuit and the shift register shown in FIG. 6. It should be noted that, for the first-stage shift register, the second input terminal (Gn−y) is electrically connected to the frame trigger terminal STV, and the first input terminal (Gn−y) of the corresponding compensation sub-circuit is electrically connected to the frame trigger terminal STV, wherein all the transistors are N-type transistors, the valid potential signal is a high-potential signal, and the invalid potential signal is a low-potential signal.

Figure 11:
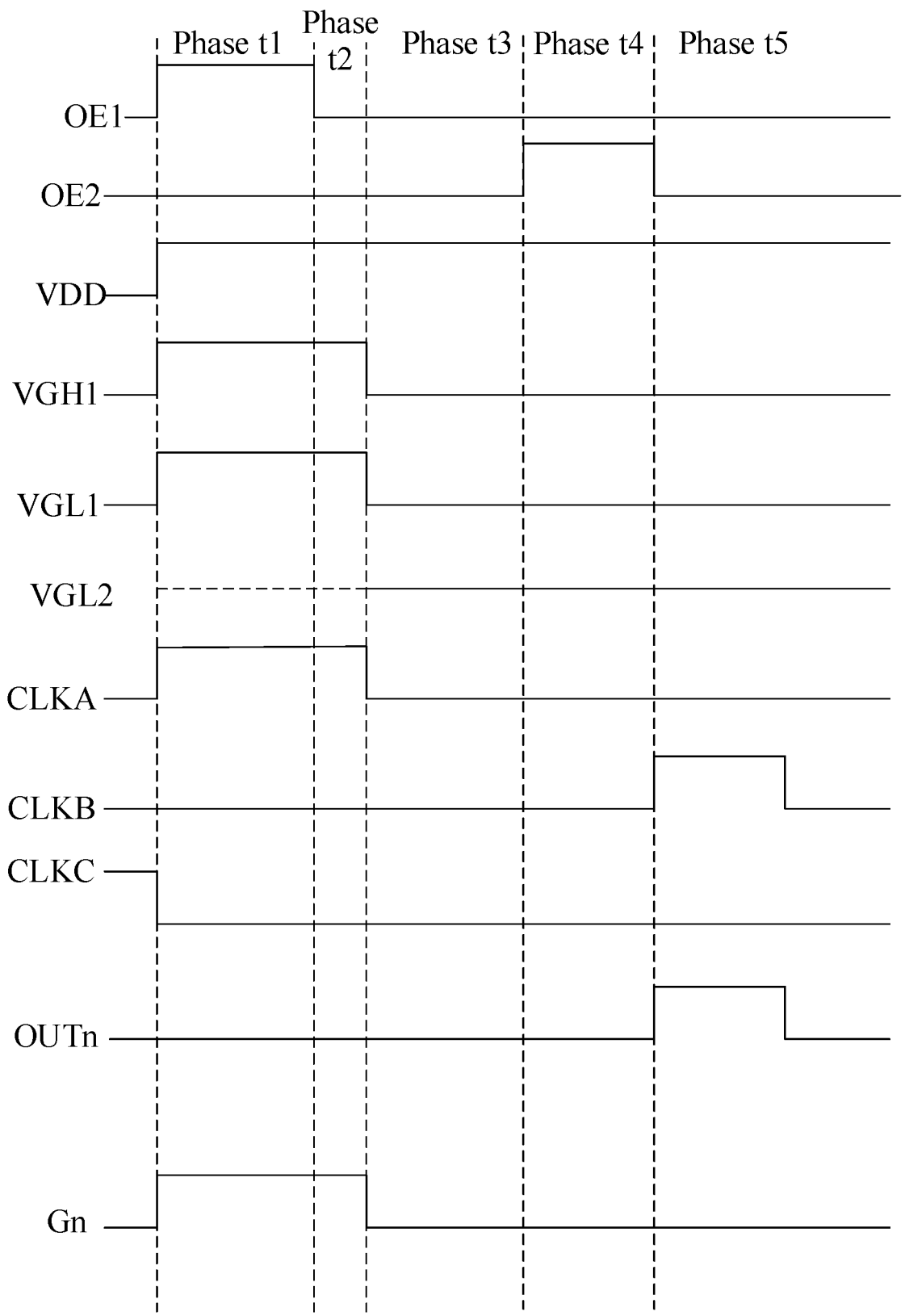
FIG. 11 is a timing diagram corresponding to the detection method according to an embodiment of the disclosure.

Specifically, refer to the timing diagram shown in FIG. 11.

In the phase t1, i.e., in the charging phase, STV=1, CLKA=1, CLKB=0, CLKC=0, VDD=1, VGL1=1 and VGH1=1, so that the cascade output terminal Gn of the shift register in each stage outputs a high-potential signal, and the drive output terminal OUTn of the shift register in each stage outputs a low-potential signal; at the same time, OE1=1 and OE2=0, so that the high-potential signal output by the cascade output terminal Gn of the shift register in each stage can be stored in the first capacitor of the compensation sub-circuit in the corresponding stage; and at the same time, no signal is applied to VGL2 to reduce the interference of its signal.

In the phase t2, that is, after the charging phase ends, OE1=0, the first capacitor stops being charged, the first power voltage terminal VDD always maintains a high voltage, and the first capacitor keeps the voltage across both terminals unchanged.

In the phase t3, i.e., in the reset phase, VGL2=0, the pull-down node QB of the shift register is pulled down; CLKA=0, the cascade output terminal Gn of the shift register in each stage outputs a low-potential signal, so that the cascade connection between the shift registers starts to be disconnected; VGH1=0, VGL1=0, the pull-up node Q is pulled down, and both the cascade output terminal and the drive output terminal output low-potential signals, so that the shift registers in the gate drive circuit are all at the low voltage, except for the compensation sub-circuits.

In the phase t4, i.e., in the discharging phase, OE2=1, the first capacitor controls the fourth transistor to turn on, and the signal of the first power voltage terminal VDD is transmitted to the pull-up node Q of the corresponding shift register through the fourth transistor and the fifth transistor.

In the phase t5, i.e., in the detection phase, CLKB=1, the drive output terminal OUTn outputs a high-potential signal to the scan signal line in the display area; and a data voltage is provided to at least one data signal line in the display area. If the voltage on the scan signal line is normal, the data voltage will be transmitted to the pixel electrode electrically connected to the data signal line in this row, to detect the voltage of the pixel electrode corresponding to the data signal line. If the voltage on the pixel electrode is this data voltage, it proves that the compensation sub-circuit in the corresponding row is normal. If the voltage on the pixel electrode is not this data voltage, it proves that the compensation sub-circuit in the corresponding row is abnormal.

The above detection method realizes the detection of the compensation sub-circuit by detecting the voltage of the pixel electrode in the display area.

Specifically, when the second pole of the first capacitor in the compensation sub-circuit includes a transparent conductive electrode disposed in the same layer as the pixel electrode, the detection of the compensation sub-circuit can also be realized by detecting the transparent conductive electrode.

Therefore, based on the same inventive concept, an embodiment of the disclosure further provides another detection method for a display substrate. As shown in FIG. 12, the detection method includes S201 and S202.

S201. A charging phase: controlling a cascade output terminal of a shift register in each stage to output a valid potential signal, so that the output control circuit disconnects a signal transmission with a pull-up node of the corresponding-stage shift register under control of the second control terminal, and the detection input circuit charges the first capacitor under control of the first control terminal and the first input terminal.

S202. A detection phase: detecting a voltage of a second pole of a first capacitor in each compensation sub-circuit, and determining whether the compensation sub-circuit is abnormal.

In a specific implementation, when the compensation sub-circuit is normal, the charge of the first capacitor in the compensation sub-circuit during the charging phase will change the voltage of the second pole of the first capacitor, so the voltage of the transparent conductive electrode of the second pole can be directly detected to determine the compensation sub-circuit is abnormal.

The foregoing detection method provided by the embodiment of the disclosure will be briefly described with reference to the structures of the compensation sub-circuit and the shift register shown in FIG. 6, wherein all the transistors are N-type transistors, the valid potential signal is a high-potential signal, and the invalid potential signal is a low-potential signal.

In the charging phase, STV=1, CLKA=1, VDD=1, VGH=1 and VGL1=1, so that the cascade output terminal Gn of the shift register in each stage outputs a high-potential signal, and the drive output terminal OUTn of the shift register in each stage outputs a low-potential signal; at the same time, OE1=1 and OE2=0, so that the high-potential signal output by the cascade output terminal Gn of the shift register in each stage can be stored in the first capacitor of the compensation sub-circuit in the corresponding stage.

In the detection phase, the voltage of the second pole of the first capacitor in each compensation sub-circuit is detected to determine whether the compensation sub-circuit is abnormal. Meanwhile, in order to reduce the signal interference, no signal may be applied to VGL2, CLKB and CLKC.

Based on the same inventive concept, an embodiment of the disclosure further provides a display apparatus, including the above-mentioned display substrate provided by the embodiments of the disclosure. Since the principle of the display apparatus to solve the problem is similar to that of the above-mentioned display substrate, the implementations of the display apparatus can refer to the implementations of the above-mentioned display substrate, and the repeated description thereof will be omitted.

In a specific implementation, the display apparatus may be a mobile phone, a tablet, a television, a display, a laptop, a digital photo frame, a navigator, or any other product or component with display functions. The implementations of this display apparatus can refer to the embodiments of the above-mentioned display panel, and the repeated description thereof will be omitted here.

Specifically, the above-mentioned display apparatus provided by the embodiment of the disclosure may further include: a timing controller configured to provide a signal to the display substrate and control a gate drive circuit to work, so as to detect whether the compensation sub-circuit is abnormal.

Optionally, the timing controller may be specifically configured to:

a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal so that the output control circuit disconnects a signal transmission with a pull-up node of a corresponding-stage shift register, and load the low-potential signal to the first control terminal so that the detection input circuit charges the first capacitor; and load the low-potential signal to the first control terminal after the charging phase ends;

a reset phase: load a corresponding signal to the shift register in each stage, and control the cascade output terminal of the shift register in each stage to output a low-potential signal and the drive output terminal of the shift register in each stage to output a low-potential signal;

a discharging phase: load a high-potential signal to the second control terminal to turn on the output control circuit with the pull-up node of the corresponding-stage shift register, and discharge only the first capacitor to the pull-up node;

a detection phase: load a corresponding signal to the shift register in each stage, control the drive output terminal of the shift register in each stage to output a high-potential signal, and provide a data voltage to at least one data signal line in a display area, so as to detect a voltage of a pixel electrode corresponding to the data signal line and determine whether each compensation sub-circuit is abnormal.

Or optionally, the timing controller may be specifically configured to:

a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal so that the output control circuit disconnects a signal transmission with a pull-up node of a corresponding-stage shift register, and load the low-potential signal to the first control terminal so that the detection input circuit charges the first capacitor; so as to detect a voltage of a second pole of the first capacitor in each compensation sub-circuit and determine whether the compensation sub-circuit is abnormal in a subsequent detection phase.

In the display substrate, the detection method therefor and the display apparatus provided by the embodiments of the disclosure, the compensation sub-circuits in one-to-one correspondence to the shift registers in all stages are arranged in the gate drive circuit; wherein the compensation sub-circuit includes a detection input circuit, a first capacitor and an output control circuit; when the shift register in each stage outputs a signal, the first capacitor in each compensation sub-circuit is charged under the control of the detection input circuit, and the compensation sub-circuit is disconnected from the pull-up node of the shift register in the corresponding stage through the output control circuit, to prevent the compensation sub-circuit from affecting the output of the shift register. When the output of the shift register in each stage is completed, the shift register in each stage stops being triggered, and the output control circuit provides the signal of the first power voltage terminal to the pull-up node of the shift register in the corresponding stage under the control of the second control terminal and the first capacitor, so as to use the compensation sub-circuit to control the output to the shift register in the corresponding stage. The output control circuit in each compensation sub-circuit can be controlled independently, so the addition of the compensation sub-circuits can realize the function of row-by-row detection or random row detection.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A detection method for a display substrate, wherein the detection method comprises:
   a charging phase: controlling a cascade output terminal of a shift register in each stage to output a valid potential signal, to enable an output control circuit of the display substrate to disconnect a signal transmission with a pull-up node of a corresponding-stage shift register of the display substrate under control of a second control terminal, and to enable a detection input circuit of the display substrate to charge a first capacitor of the display substrate under control of a first control terminal and a first input terminal;
   a reset phase: controlling all nodes containing the pull-up node and the cascade output terminal of the shift register in each stage to output invalid potential signals;
   a discharging phase: turning on the output control circuit with the pull-up node of the corresponding-stage shift register under control of the second control terminal, and discharging only the first capacitor to the pull-up node; and
   a detection phase: controlling a drive output terminal of the shift register in each stage to output a valid potential signal, providing a data voltage to at least one data signal line in a display area, detecting a voltage of a pixel electrode corresponding to the data signal line, and determining whether each of compensation sub-circuits of the display substrate is abnormal.

2. The detection method of claim 1, wherein the charging phase further comprises:
   controlling the cascade output terminal of the shift register in each stage to output a high-potential signal and the drive output terminal of the shift register in each stage to output a low-potential signal; and
   loading the high-potential signal to the first control terminal, and loading the low-potential signal to the second control terminal.

3. The detection method of claim 2, wherein, after the charging phase ends and before the reset phase, the method further comprises:
   loading a low-potential signal to the first control terminal.

4. The detection method of claim 3, wherein the reset phase further comprises:
   controlling the cascade output terminal of the shift register in each stage to output a low-potential signal and the drive output terminal of the shift register in each stage to output a low-potential signal.

5. The detection method of claim 4, wherein the discharging phase further comprises:
   loading a high-potential signal to the second control terminal;
   wherein the detection phase further comprises:
   controlling the drive output terminal of the shift register in each stage to output a high-potential signal.

6. A detection method for a display substrate, wherein the detection method comprises:
   a charging phase: controlling a cascade output terminal of a shift register in each stage to output a valid potential signal, to enable an output control circuit of the display substrate to disconnect a signal transmission with a pull-up node of a corresponding-stage shift register of the display substrate under control of a second control terminal, and to enable a detection input circuit of the display substrate to charge a first capacitor of the display substrate under control of a first control terminal and a first input terminal; and
   a detection phase: detecting a voltage of a second pole of the first capacitor in each compensation sub-circuit of the display substrate, and determining whether the compensation sub-circuit is abnormal.

7. The detection method of claim 6, wherein the charging phase further comprises:
   controlling the cascade output terminal of the shift register in each stage to output a high-potential signal and the drive output terminal of the shift register in each stage to output a low-potential signal; and
   loading the high-potential signal to the first control terminal, and loading the low-potential signal to the second control terminal.

8. A display apparatus, comprising a display substrate, wherein the display substrate has a display area and a frame area; the frame area is provided with a gate drive circuit; the gate drive circuit comprises a plurality of shift registers cascaded on a base substrate and compensation sub-circuits in one-to-one correspondence to the shift registers; and each of the compensation sub-circuits comprises: a detection input circuit, a first capacitor and an output control circuit; wherein:
   the detection input circuit is electrically connected to a first control terminal, a first input terminal, and first and second poles of the first capacitor respectively; the detection input circuit is configured to charge the first capacitor under control of the first control terminal and the first input terminal; a first input terminal of a compensation sub-circuit corresponding to a $n^{th}$-stage shift register is electrically connected to a cascade output terminal of a $(n-y)^{th}$-stage shift register, wherein y is an integer greater than or equal to 1;
   the second pole of the first capacitor is electrically connected to a first power voltage terminal; and
   the output control circuit is electrically connected to a second control terminal, the first pole of the first capacitor, the first power voltage terminal, and a pull-up node of a corresponding-stage shift register respectively, and the output control circuit is configured to provide a signal of the first power voltage terminal to the pull-up node of the corresponding-stage shift register under control of the second control terminal and the first capacitor;
   the display apparatus further comprises: a timing controller configured to:
   a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal to enable the output control circuit to disconnect a signal transmission with a pull-up node of a corresponding-stage shift register, and load the low-potential signal to the first control terminal to enable the detection input circuit to charge the first capacitor; and load the low-potential signal to the first control terminal after the charging phase ends;
   a reset phase: load a corresponding signal to the shift register in each stage, and control the cascade output terminal of the shift register in each stage to output a low-potential signal and the drive output terminal of the shift register in each stage to output a low-potential signal;

a discharging phase: load a high-potential signal to the second control terminal to turn on the output control circuit with the pull-up node of the corresponding-stage shift register, and discharge only the first capacitor to the pull-up node; and a detection phase: load a corresponding signal to the shift register in each stage, control the drive output terminal of the shift register in each stage to output a high-potential signal, and provide a data voltage to at least one data signal line in the display area, to detect a voltage of a pixel electrode corresponding to the data signal line and determine whether each of the compensation sub-circuits is abnormal.

9. The display apparatus of claim 8, further comprising: a timing controller configured to:

a charging phase: load a corresponding signal to a shift register in each stage, and control a cascade output terminal of the shift register in each stage to output a high-potential signal and a drive output terminal of the shift register in each stage to output a low-potential signal; load the low-potential signal to the second control terminal to enable the output control circuit to disconnect a signal transmission with a pull-up node of a corresponding-stage shift register, and load the low-potential signal to the first control terminal to enable the detection input circuit to charge the first capacitor, to detect a voltage of the second pole of the first capacitor in each compensation sub-circuit and determine whether the compensation sub-circuit is abnormal in a subsequent detection phase.

* * * * *